(12) United States Patent
Auguste et al.

(10) Patent No.: US 9,578,748 B1
(45) Date of Patent: Feb. 21, 2017

(54) AMBIENT ENERGY POWERED ELECTRONIC GASKETS

(71) Applicant: ALPHA AND OMEGA, INC., Denver, CO (US)

(72) Inventors: Donna Marie Auguste, Denver, CO (US); David Edward Hayes, Denver, CO (US); Klaus Dimmler, Colorado Springs, CO (US)

(73) Assignee: ALPHA AND OMEGA, INC., Denver, CO (US)

( * ) Notice: Subject to any disclaimer, the term of this patent is extended or adjusted under 35 U.S.C. 154(b) by 165 days.

(21) Appl. No.: 13/972,832

(22) Filed: Aug. 21, 2013

(51) Int. Cl.
*H05K 5/00* (2006.01)
*H05K 1/16* (2006.01)

(52) U.S. Cl.
CPC ...................................... *H05K 1/16* (2013.01)

(58) Field of Classification Search
CPC ....... H01B 11/12; H01B 7/0838; H01B 17/26; H01J 5/20; H01J 5/30; H01J 5/32; H01J 5/48; H05K 5/06; H05K 9/0015; H05K 9/0018; H05K 5/0095; H05K 1/16; H01F 27/04; H01L 23/10; G01M 3/00; G01M 3/36; G01L 19/0046; G01L 19/06; G01L 19/0609; G01L 19/0618; G01L 19/0627
USPC .................................................. 174/32, 488
See application file for complete search history.

(56) References Cited

U.S. PATENT DOCUMENTS

| | | | | |
|---|---|---|---|---|
| 3,027,416 A * | 3/1962 | Kissel | .................... | H02G 3/185 174/57 |
| 4,283,914 A * | 8/1981 | Allen | ......................... | 60/641.14 |
| 5,024,904 A * | 6/1991 | Curiel | ........................... | 429/405 |
| 5,428,288 A | 6/1995 | Foreman et al. | | |
| 5,751,134 A * | 5/1998 | Hoerner et al. | .............. | 320/124 |
| 6,131,462 A * | 10/2000 | EerNisse | ............. | G01L 19/0092 73/702 |
| 6,588,766 B2 * | 7/2003 | Shattuck | ................ | F16J 15/106 277/591 |
| 7,389,695 B2 * | 6/2008 | Skwara | ................. | G01L 19/086 73/708 |
| 8,188,400 B2 * | 5/2012 | Lee | ............................. | 200/534 |
| 8,371,156 B2 * | 2/2013 | Toth | ...................... | F16J 15/064 73/114.18 |

(Continued)

OTHER PUBLICATIONS

Laske, Matthias; Ludwig, Josef; Unseld, Günther; Weiβ, Alfred; "Cylinder Head Gaskets with Integrated Temperature Sensors Detecting Critical Component Temperatures in the Heart of the Engine", ATZonline.com; MTZ worldwide Edition: Dec. 2002, Printed: Aug. 21, 2013, pp. 1-2; Website: http://www.atzonline.com/Article/1132/Cylinder-Head-Gaskets-with-Integrated-Temperature-Sensors-Detecting-Critical-Component-Temperatures-in-the-Heart-of-the-Engine.html.

(Continued)

*Primary Examiner* — Angel R Estrada
*Assistant Examiner* — Pete Lee
(74) *Attorney, Agent, or Firm* — TIPS Group

(57) ABSTRACT

In an embodiment, set forth by way of example and not limitation, an ambient energy powered electronic gasket includes an insulating gasket body adapted to engage a surface of a powered device, and an electronic circuit enclosed within the gasket body including a DC power supply powered by an ambient energy source related to the powered device with which it is engaged. The ambient energy source can be an AC power source, electromagnetic energy, mechanical, heat, chemical, fluid flow, etc., by way of non-limiting examples.

19 Claims, 14 Drawing Sheets

(56) References Cited

U.S. PATENT DOCUMENTS

| | | | |
|---|---|---|---|
| 2005/0115311 A1* | 6/2005 | Kestly | F02F 11/002 73/114.18 |
| 2006/0219022 A1* | 10/2006 | Ohta | G01L 9/0055 73/754 |
| 2008/0224861 A1 | 9/2008 | McNeely et al. | |
| 2008/0309027 A1* | 12/2008 | Rogeon | F16J 15/122 277/653 |
| 2011/0014800 A1 | 1/2011 | Cheng et al. | |
| 2011/0109301 A1 | 5/2011 | Johnson et al. | |
| 2011/0276289 A1 | 11/2011 | Park et al. | |
| 2011/0304154 A1* | 12/2011 | Rosendall | F03G 3/02 290/1 R |
| 2011/0316690 A1 | 12/2011 | Siegman | |

OTHER PUBLICATIONS

Product Brochure, "SensorCS® Cylinder-Head Gaskets", Dana Limited, Aug. 21, 2013; p. 1; Website: http://162.74.99.105/Automotive_Systems/Products/Sealing%20Products/CHG/sensor_gasket.aspx.

* cited by examiner

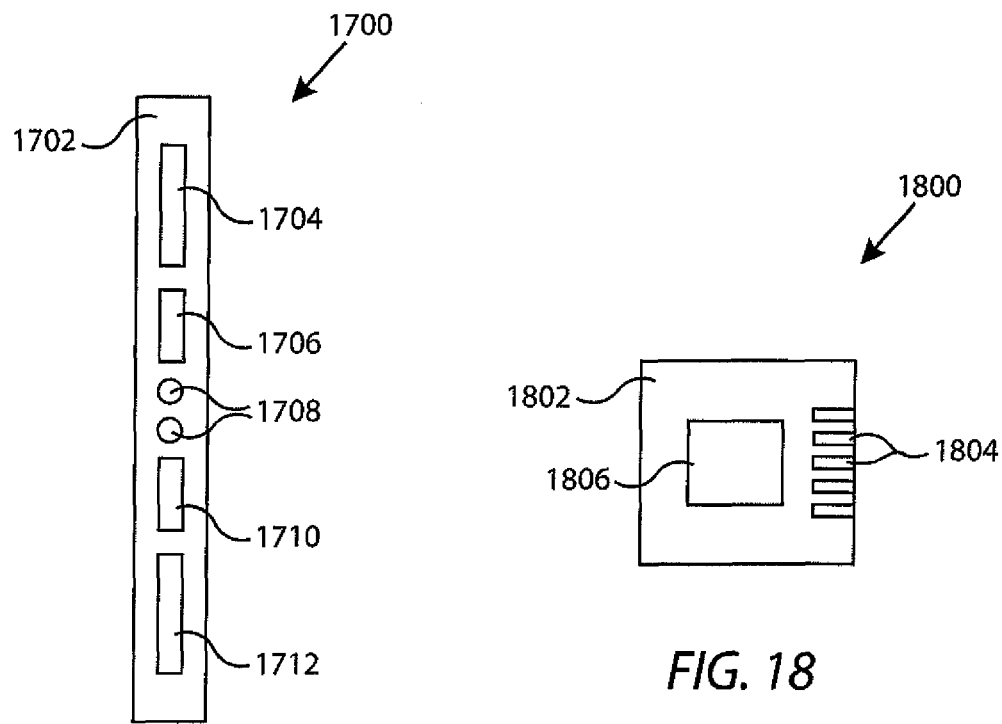
FIG. 17
FIG. 18
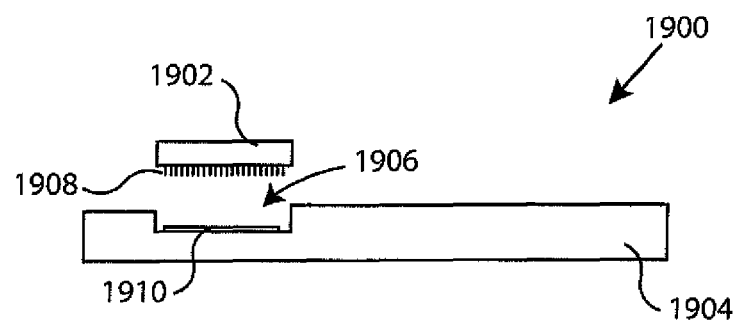
FIG. 19

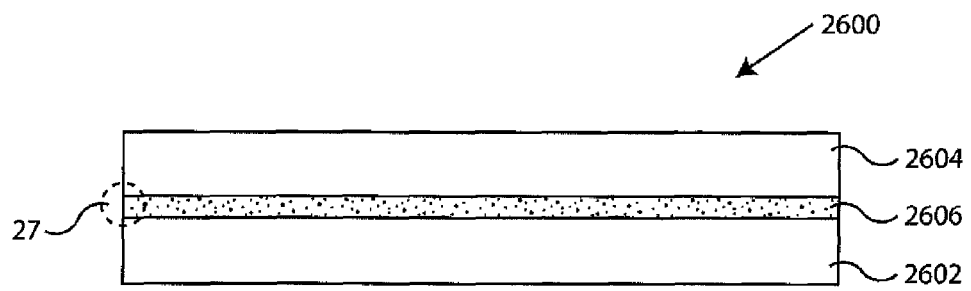
FIG. 26
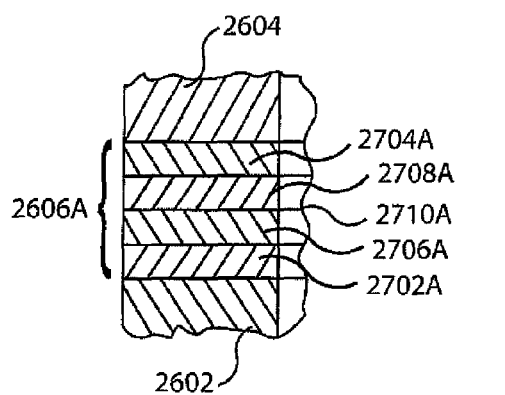 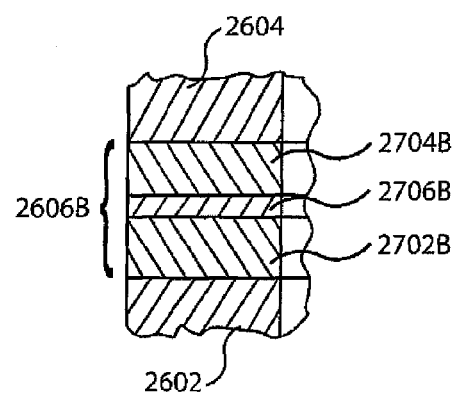
FIG. 27A                    FIG. 27B

AMBIENT ENERGY POWERED ELECTRONIC GASKETS

CROSS-REFERENCE TO RELATED APPLICATIONS

This application is related to U.S. patent application Ser. No. 13/767,659, filed Feb. 14, 2013, for Sensors for Electrical Connectors, which is incorporated herein by reference.

BACKGROUND

A gasket is a mechanical seal which fills the space between two or more mating surfaces, generally to prevent leakage from or into the jointed objects while under compression. Gaskets come in many shapes and sizes and are often cut or punched from a flat material. An O-ring is a form of gasket in the shape of a torus and is generally formed as a loop of elastomeric material with a round cross-section.

It is usually desirable that a gasket be made from a material that is, to some extent, yielding such that it is able to deform and tightly fill the space for which it is designed, including any slight irregularities. Gaskets for specific applications, such as high pressure steam systems, may include asbestos. Some (piping) gaskets are made entirely of metal and rely on a seating surface to accomplish the seal. However, most gaskets are made from paper, rubber, silicone, metal, cork, felt, neoprene, nitrile rubber, fiberglass, polytetrafluoroethylene (aka PTFE or Teflon) or a plastic polymer.

Energy harvesting (also known as power harvesting or energy scavenging) is the process by which energy is derived from external sources (e.g., solar, thermal energy, wind energy, salinity gradients, and kinetic energy), is captured and stored. Energy harvesting devices converting ambient energy into electrical energy have attracted much interest in both the military and commercial sectors. Some systems convert motion, such as that of ocean waves, into electricity to be used by oceanographic monitoring sensors for autonomous operation. Future applications may include high power output devices (or arrays of such devices) deployed at remote locations to serve as reliable power stations for large systems. Another application is in wearable electronics, where energy harvesting devices can power or recharge cellphones, mobile computers, radio communication equipment, etc. All of these devices must be sufficiently robust to endure long-term exposure to hostile environments and have a broad range of dynamic sensitivity to exploit the entire spectrum of wave motions.

Conventional energy harvesting apparatus are relatively large and bulky and are designed to provide considerable amounts of power, e.g. to recharge a cell phone. Such apparatus tend not to address the micro-sensor market which have very small form factors and which require very little power.

"SensorCS" cylinder-head gasket technology "integrates pressure and temperature sensors directly into gaskets." The SensorCS gaskets are described on-line by DANA Automotive. AZT online describes "SensoriCS" cylinder head gaskets with integrated temperature sensors. To the extent that these references are understood, it would appear that passive sensors, e.g. thermocouples and/or piezoelectric materials, are embedded in a gasket that is provided with a tab or dongle to allow the sensors to be connected to testing or monitoring equipment. There is no reference to the use of active components, energy generation devices, or wireless communication apparatus embedded within the gaskets.

These and other limitations of the prior art will become apparent to those of skill in the art upon a reading of the following descriptions and a study of the several figures of the drawing.

SUMMARY

In an embodiment, set forth by way of example and not limitation, an ambient energy powered electronic gasket includes an insulating gasket body adapted to engage a surface of a powered device, and an electronic circuit enclosed within the gasket body including a DC power supply powered by an ambient energy source related to the powered device with which it is engaged. The ambient energy source can be an AC power source, electromagnetic energy, mechanical, heat, chemical, fluid flow, etc., by way of non-limiting examples.

In an embodiment, set forth by way of example and not limitation, a power storage device, such as a battery and/or capacitor, is coupled to the DC supply. In further example embodiments, a sensor is provided as part of the electronic circuit. In a still further non-limiting example, a port is provided (either wired or wireless) to allow information and/or power to be transmitted from the gasket.

As opposed to the simple, passive sensor gaskets of the prior art, embodiments as set forth herein are capable of sophisticated processes including wireless communication of the sensor data and energy harvesting and often include an number of active electronic components or "elements" embedded in the gasket body capable of performing a variety specialized and generalized tasks. Due to the electronic sophistication of certain embodiments of the gaskets, example embodiments can be context-aware and/or opportunistic—e.g., certain odors can be detected for certain gasket environments and multiple gaskets can cooperate in ways that are different from their default roles.

An advantage of certain example embodiments is that ambient energy can be harvested to provide electrical power for the electronic gasket and/or other devices.

Another advantage of certain example embodiments is that the electronic gasket performs both as gasket and as an energy harvester and/or sensor. Therefore, a single device replaces the functionality of several devices and requires little or no additional real estate proximate to the powered device.

These and other combinations and advantages and other features disclosed herein will become apparent to those of skill in the art upon a reading of the following descriptions and a study of the several figures of the drawing.

BRIEF DESCRIPTION OF THE DRAWINGS

Several examples will now be described with reference to the drawings, wherein like components are provided with like reference numerals. The examples are intended for the purpose of illustration and not limitation. The drawings include the following figures:

FIG. 17 is a side view of one example implementation of a gasket;

FIG. 18 is a top plan view of an example implementation of a sensor module which can be used with some implementations of a gasket;

FIG. 19 is a side view of an example implementation of a gasket and sensor module allowing connection of a sensor module to a gasket platform;

FIG. 26 is an elevational view of a gasket with one or more inner layers;

FIG. 27A is an illustration taken along broken line 27 of a first embodiment of a gasket of FIG. 26 and FIG. 27B is an illustration taken along broken line 27 of a second embodiment of a gasket of FIG. 26.

DETAILED DESCRIPTION OF EXAMPLE EMBODIMENT(S)

Gaskets are used in a wide variety of applications including consumer and high performance automotive, motorcycle/ATV/snowmobiles, agricultural vehicles, heavy equipment, buses, trains, airplanes, fuel and oil dispensing, oil refinery/storage/distribution, appliances such as washing machines and dishwashers, marine vessels, spaces where air pressure is significant, spacecraft, clean rooms, nuclear power plants, industrial pumps, food/beverage manufacturing/storage/distribution, metal and precious metal manufacturing/recycling, pulp and paper manufacturing/recycling, glass manufacturing/recycling, pneumatic power tools, HVAC (heating ventilation air conditioning), boilers, refrigerated storage and transportation to name a few. Example embodiments as set forth herein embed, incorporate and/or attach sensors and/or energy harvesting circuitry to gaskets of many types to provide localized sensing and/or power.

For example, sensor gaskets as disclosed herein can participate in localized sensing that may be duplicative of other sensors (e.g. sensing car oil temperature) but can also extend the sensing environment to new applications. By way of a non-limiting example, the gasket/weather stripping around a car window can be used to sense proximity, direction and/or speed of other moving cars, particularly in a vehicle's blind spot. This allows, for example, the deployment of airbags before the moment of impact with another vehicle.

In certain example embodiments, electronic circuitry is entirely or partially embedded within the body of the gasket. In other example embodiments, circuitry and/or components are can be provided on surfaces or edges of the gasket. In still further embodiments edge connectors and/or dongles can further extend the sensing or power distribution reach of the gasket. These and other variations and configurations will be discussed with respect to certain example embodiments.

Figure 1:
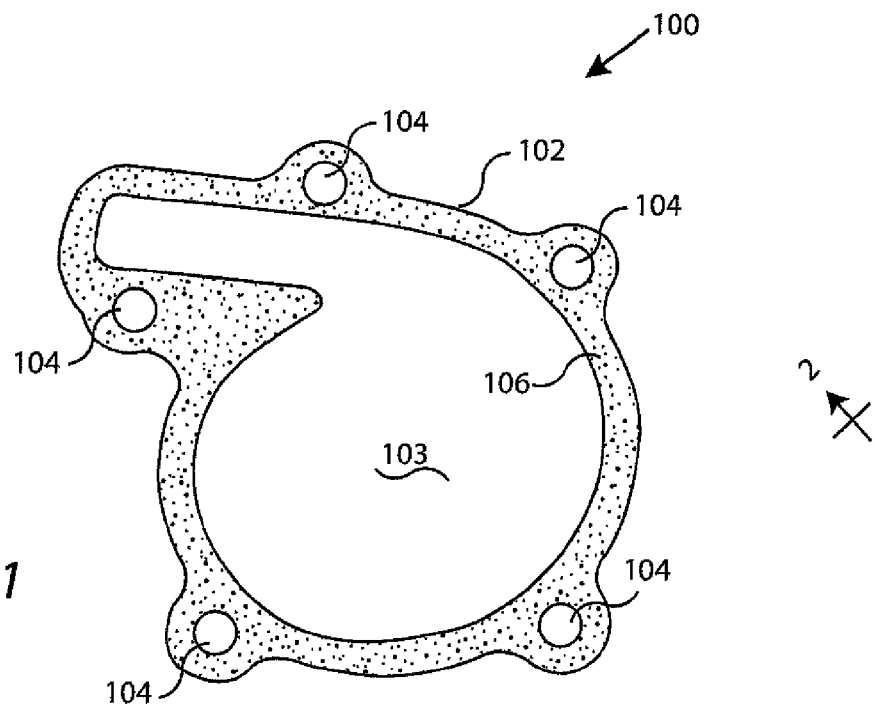
FIG. 1 is a top plan view of a first example gasket.
Figure 2:
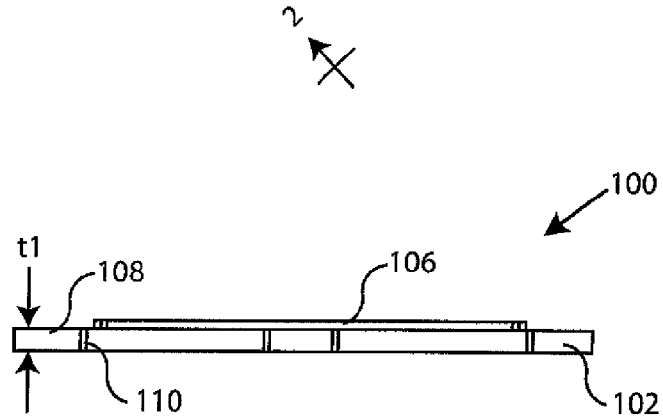
FIG. 2 is an elevational view of the first example gasket taken along line 2-2 of FIG. 1.

FIG. 1 is a top plan view of a first example gasket 100 which can be used, by way of non-limiting example, with a fluid pump. FIG. 2 is an elevational view of the first example gasket 100 taken along line 2-2 of FIG. 1. The gasket 100 includes a gasket body 102 defining an aperture 103 for the liquid that is to be pumped. A number of bolt-holes 104 are provided, as is a raised rim 106 which promotes a tight seal around the aperture 103 during use. The gasket body 102, of this example gasket 100, encloses or embeds electronic circuitry, as will be discussed subsequently. The gasket 100 is substantially planar in this non-limiting embodiment, with a first surface 108 and a second surface 110 substantially parallel thereto, providing a thickness "t1" for the gasket body 102. In other embodiments gaskets are contoured or shaped such that that their first and second surfaces are not configured as planar parallel surfaces and such that their cross-sectional thicknesses are variable.

Figure 3:
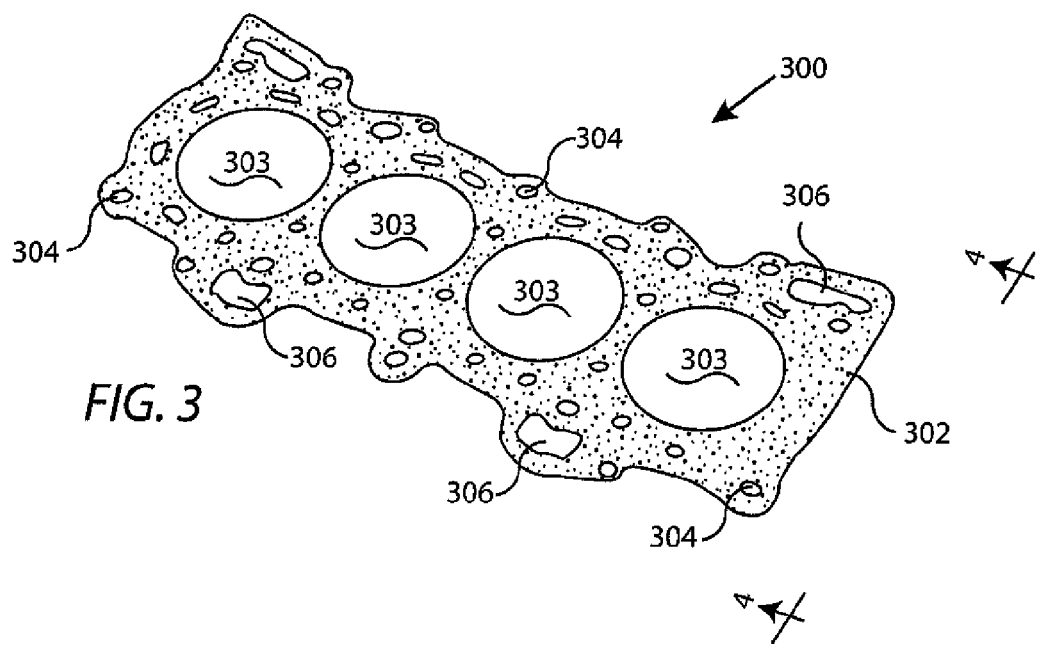
FIG. 3 is a perspective view of a second example gasket.
Figure 4:
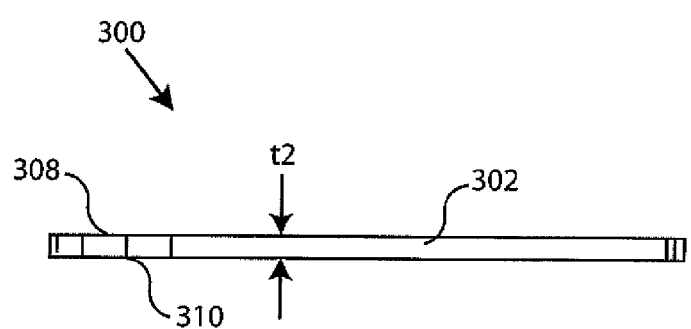
FIG. 4 is an elevational view of the second example gasket taken along line 4-4 of FIG. 3.

FIG. 3 is a perspective view of a second example gasket 300 which can be used, by way of non-limiting example, in an internal combustion engine block. FIG. 4 is an elevational view of the second example gasket 300 taken along line 4-4 of FIG. 3. The gasket 300 includes a gasket body 302 defining a number of apertures 303 for the engine cylinders. A number of bolt-holes 304 are provided, as are other passages 306. The gasket body 302, of this example gasket 300, encloses or embeds electronic circuitry, as will be discussed subsequently. The gasket 300 is substantially planar, in this non-limiting example, which a first surface 308 and a second surface 310 substantially parallel thereto, providing a thickness "t2" for the gasket body 302. In other embodiments gaskets are contoured or shaped such that that their first and second surfaces are not configured as planar parallel surfaces and such that their cross-sectional thicknesses are variable.

Figure 5:
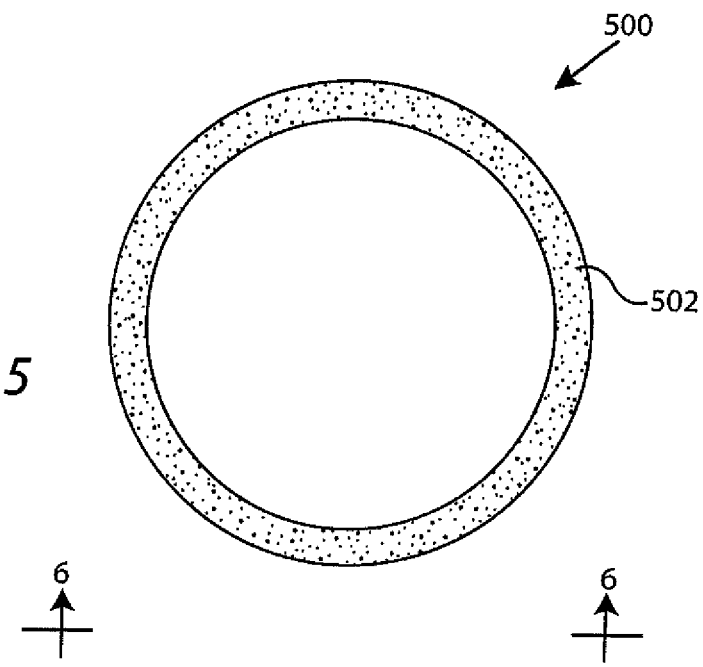
FIG. 5 is a top plan view of a third example gasket.
Figure 6:
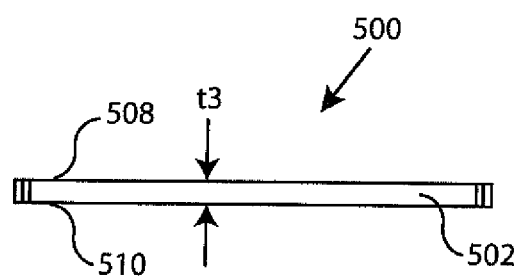
FIG. 6 is an elevational view of the third example gasket taken along line 6-6 of FIG. 5.

FIG. 5 is a top plan view of a third example gasket 500 known as an "O-ring." FIG. 6 is an elevational view of the third example gasket 500 taken along line 6-6 of FIG. 5. The gasket 500, in this non-limiting example, has a gasket body 502 that is substantially toroidal with a circular cross section and may be configured to be seated in a pair of grooves of two mating surfaces. The gasket body 502, of this example gasket 500, encloses or embeds electronic circuitry, as will be discussed subsequently. The gasket 500 can be considered to have a first curved surface 508 facing an opposing curved surface 510, providing a thickness "t3" for the gasket body 502.

Figure 7:
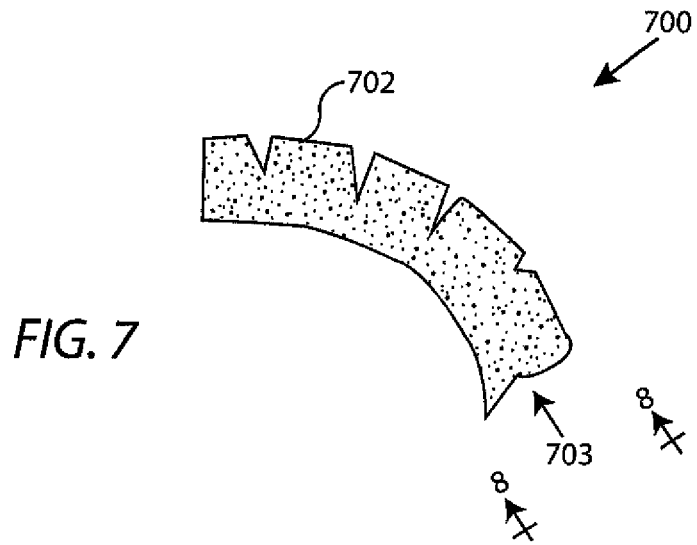
FIG. 7 is a perspective view of a fourth example gasket.
Figure 8:
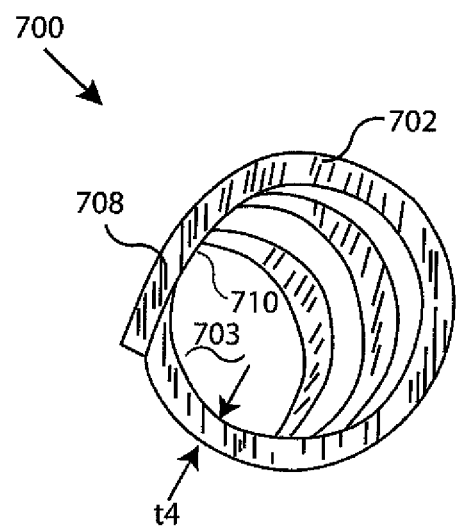
FIG. 8 is an elevational view of the fourth example gasket taken along line 8-8 of FIG. 7.

FIG. 7 is perspective view of a fourth example gasket 700, which is commonly known as a spiral cable organizer. FIG. 8 is an elevational view of the fourth example gasket 700 taken along line 8-8 of FIG. 7. The gasket 700 includes a gasket body 702 defining a spiral band around a central aperture 703 which can accommodate a number of wires or cables. The gasket body 702, of this example gasket 700, encloses or embeds electronic circuitry, as will be discussed subsequently. The spiral band which makes up the gasket 700 is substantially planar in this non-limiting example, with a first surface 708 and a second surface 710 substantially parallel thereto, providing a thickness "t4" for the gasket body 702. In other embodiments gaskets are contoured or shaped such that that their first and second surfaces are not configured as planar parallel surfaces and such that their cross-sectional thicknesses are variable.

Gaskets are also provided in other example configurations and/or form factors. For example, gaskets can be provided as a tight-fitting, thick "rubber band" or as a "zip-tie" or "twist-tie" to fit around one or more cables, pipes, devices, etc. These example configurations include a body portion which can at least partially enclose electronic circuitry that can obtain and/or transmit ambient power and/or provide a sensing or monitoring function. Opposing surfaces of the gaskets can be planar or non-planar, and the thicknesses of a particular gasket can vary.

Most electrically powered machinery generates an ambient 60 Hertz (HZ) electric field from the power cords, power supply, etc. Several example embodiments discussed herein are well suited for harvesting this ambient energy. For example, spiral cable organizer gasket 700, when properly configured, can be provided around the power cord leading to a motor. The rubber band, zip-tie and twist-tie examples above are also suitable for such purposes.

Figure 9:
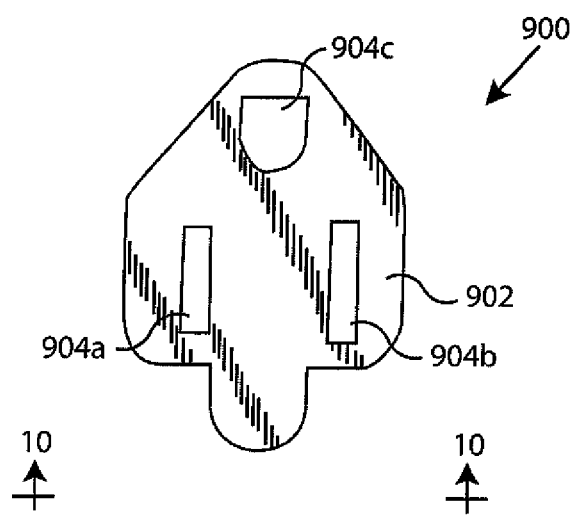
FIG. 9 is a top plan view of a fifth example gasket.
Figure 10:
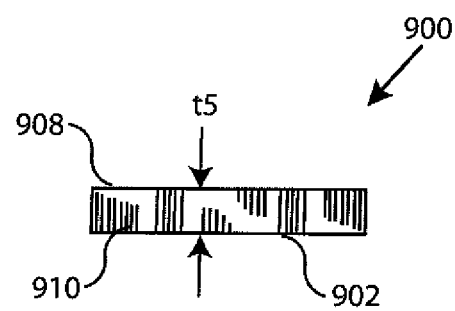
FIG. 10 is an elevational view of the fifth example gasket taken along line 10-10 of FIG. 9.

FIG. 9 is a top plan view of a fifth example gasket 900 which can be used with a three-prong electric wall plug. FIG. 10 is an elevational view of the fifth example gasket 900 taken along line 10-10 of FIG. 9. The gasket 900 includes a gasket body 902 defining a number of apertures 904a, 904b and 906c for the passage of the hot, neutral and ground prongs of an electric wall plug. The gasket body 902, of this example gasket 900, encloses or embeds electronic circuitry, as will be discussed subsequently. The gasket 900 is substantially planar, in this non-limiting example, with a first surface 908 and a second surface 910 substantially parallel thereto, providing a thickness "t5" for the gasket body 902. In other embodiments gaskets are contoured or shaped such that that their first and second surfaces are not configured as planar parallel surfaces and such that their cross-sectional thicknesses are variable.

It will be appreciated that the term "gasket" describes articles of manufacture of various configurations. As used herein, a "gasket" is a device having a substantially solid, insulating body provided with opposing first and second surfaces (which may or may not be planar and/or parallel) and an electronic circuit typically at least partially disposed within the insulating body, where the gasket is configured to be supported by and/or engage an article (such as a plug, cable, pipe etc.) or piece of equipment (e.g. a machine, pump, electrical device, etc.) from which it may harvest energy and/or provide sensing or monitoring capabilities. In the cases of the first gasket 100, the second gasket 200, and the third gasket 300, the gaskets are compressed between two surfaces of a machine or engine. In the case of the fourth gasket 700, the spiral cable organizer can wrap around electrical cords or cables and derive energy therefrom. In the case of the fifth gasket 900, it is operationally located between an electric plug and a wall socket, even though may or may not be under compression depending upon the force exerted on the plug when it is engaged with the wall socket.

The materials of the example gaskets as described above will be dependent upon their uses. For example, the gasket 100, which is used in a pump, may have to be resistant to caustic chemicals. As another example, the internal combustion engine gasket 300 must be resistant to high temperatures. However, for each of the gaskets, it is desirable that they be formed of insulating materials, at least at their points of contact with the electronic circuitry and/or electrical connectors that they enclose and/or embed. In various embodiments, the gaskets may be made, by way of non-limiting examples, from paper, rubber, silicone, metal, cork, felt, neoprene, nitrile rubber, fiberglass, polytetrafluoroethylene (aka PTFE or Teflon) or a plastic polymer.

Figure 11:
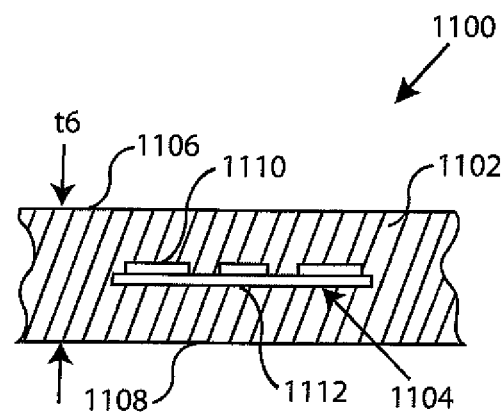
FIG. 11 is a cross-sectional view of an example gasket with embedded electronic circuitry.

FIG. 11 is a cross-sectional view of an example gasket 1100 having a body 1102 and embedded electronic circuitry 1104. The body 1102 is preferably made from an insulating material and, in this non-limiting example, has a substantially planar upper surface 1106 and a substantially planar lower surface 1108 that is substantially parallel to the upper surface 1106. In this example, the gasket 1100 has a thickness "t6". In other embodiments gaskets are contoured or shaped such that that their first and second surfaces are not configured as planar parallel surfaces and such that their cross-sectional thicknesses are variable. As will be discussed subsequently, the electronic circuitry 1104 (which is shown here having components 1110 mounted on a circuit board 1112) scavenges its energy from the ambient environment.

Figure 12:
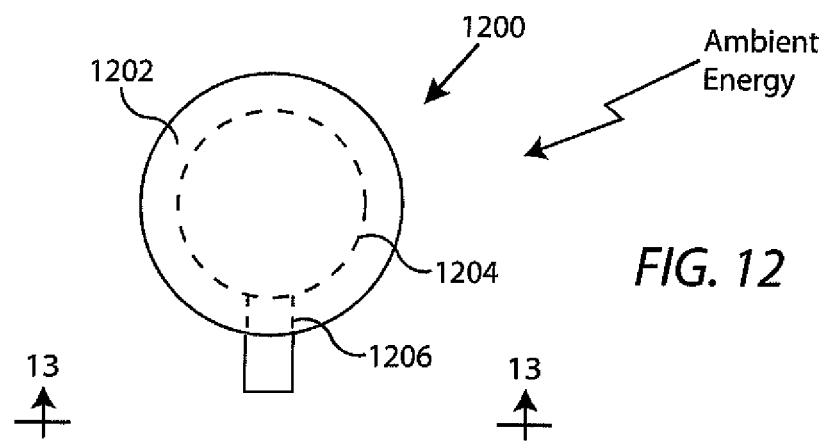
FIG. 12 is an illustration of an example gasket with embedded electronic circuitry deriving power from ambient energy.
Figure 13:
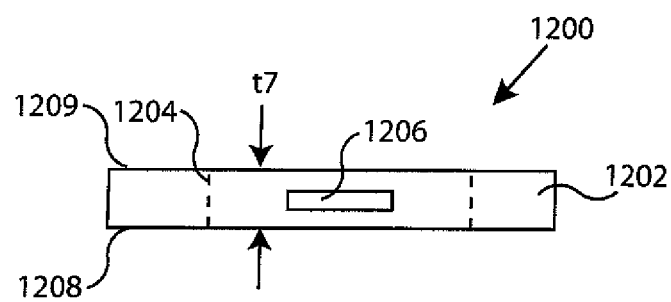
FIG. 13 is an elevational view taken along line 13-13 of FIG. 12.

FIG. 12 is an illustration of an example gasket 1200 having a body 1202 with embedded electronic circuitry 1204 deriving power from ambient energy impinging upon the gasket 1200. FIG. 13 is an elevational view taken along line 13-13 of FIG. 12 showing the gasket 1200 as having a thickness "t7" between a lower surface 1208 and an upper surface 1209. In this illustration, a port ("edge connector") 1206 is shown which allows power (e.g. low-voltage DC power) to be provide to external circuitry (not shown), such as sensors. By using the embodiment of FIG. 12, external batteries or wired power sources can be eliminated for the powering of small sensors, such as temperature gauges, in many cases. The edge connector 1206 can also carry signals, such as sensor data, from and to the electronic circuitry 1204. The edge connector can be wireless, or be optical (e.g. an LED/photoemitter pair) to provide galvanic isolation, or may be a wired connector or dongle.

There are many applications for the gasket configuration as described above with respect to FIGS. 12 and 13. For example, an edge connector (or dongle) can connect to sensors to provide remote temperature monitoring for pump surfaces, antennas, signal amplifiers, microphones, and/or PTZ cameras. The edge connector can also be used to extend reach into different media/species without compromising the sealed environment (e.g. cameras extending into water around a submarine on an articulating arm or a telescoping arm, functioning like a retractable eyeball), and for small monitors on articulating arms (e.g. video security systems). By way of non-limiting examples, edge connectors include audio connectors (e.g. 2.5 mm sub-mini audio jacks), mini-USB and micro-USB connectors with USB 2.0/3.0 protocol for data and power, IEEE 1394 for data (e.g. Firewire, fiber optic, coaxial), coaxial connectors for communication antennas (e.g. 1.37 mm RF and 1.48 mm RF), and LED connectors as status indicators.

Figure 14:
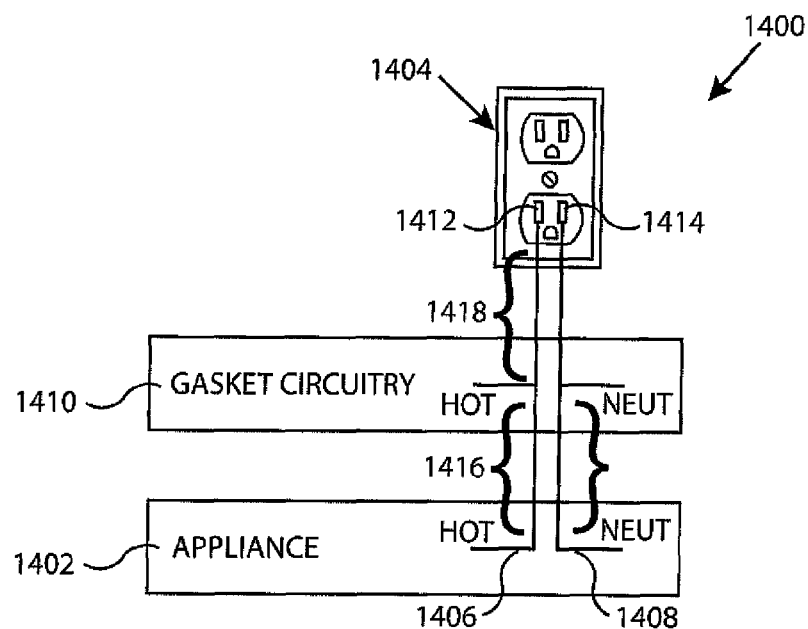
FIG. 14 is a diagrammatic illustration of an example implementation including one or more of the sensing gasket features described herein.

FIG. 14 is a diagrammatic illustration of an example implementation 1400 including one or more of the sensing features described herein. In this example, power can be distributed to an appliance that is plugged into an electrical outlet using an appliance connector with a gasket slipped over the prongs of the appliance connector. With reference to FIG. 14, an appliance 1402 is electrically connected to a power supply connector such as an electrical outlet 1404 by a hot wire 1406 and a neutral wire 1408. Gasket circuitry 1410, of this non-limiting example, is within a gasket engaged with the appliance connector and is also coupled to the hot wire 1406 and the neutral wire 1408. In other example embodiments, the gasket circuitry 1410 is coupled only to the hot wire 1406, e.g. there is no neutral wire connection.

Power is provided to appliance 1402 through hot wire 1406 connected to hot outlet opening 1412, and neutral wire 1408 is connected to neutral outlet opening 1414. Power is provided to the gasket circuitry 1410 by drawing power from hot wire 1406 and neutral wire 1408, such that the gasket circuitry is connected electrically in parallel to the appliance 1402. In this circuit configuration, the current drawn by appliance 1402 flows through a segment 1416 of hot wire 1406 between the appliance 1402 and the hot connection of the gasket circuitry 1410. Segment 1418 carries the cumulative current drawn by appliance 1402 and gasket circuit 1410.

The current drawn by gasket circuitry 1410 is independent of the current drawn by appliance 1402. In some implementations, the hot wire 1406 passes through an opening in the gasket housing the gasket circuitry 1410. The current drawn by the appliance 1402 can be measured by the gasket by determining the current passing through hot wire 1406. In some implementations, this current can be measured by measuring an electromagnetic field radiated by hot wire 1406, as described below.

Figure 15:
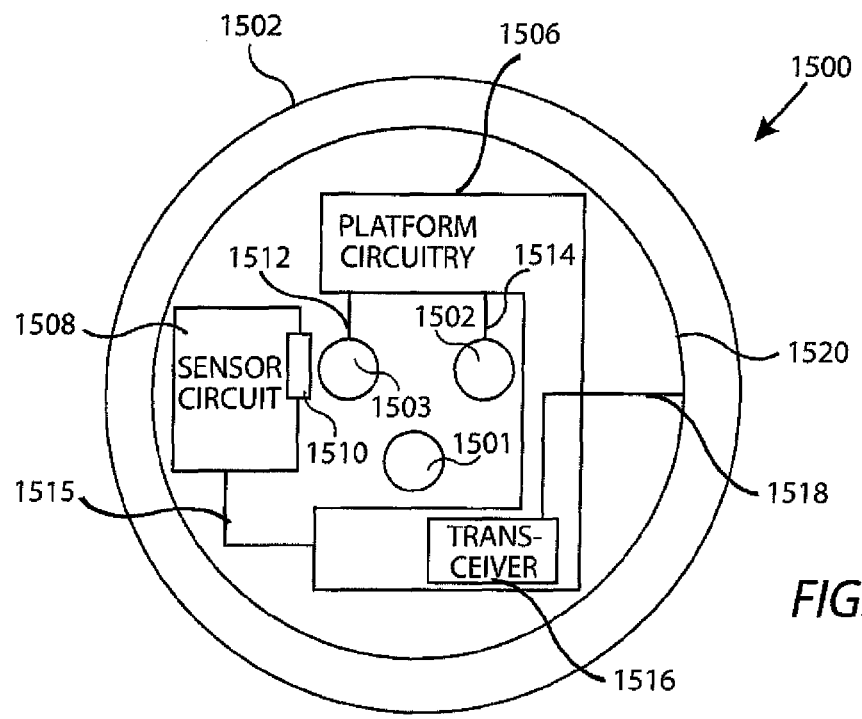
FIG. 15 is a top view of an example gasket circuit board which can be used in some implementations.

FIG. 15 is a top view of an example circuit board 1500 which can be used in some implementations of a sensing apparatus, including a sensing gasket as described herein. In this example, the circuit board 1500 utilizes a round circuit board or substrate 1502 and in some implementations can include multiple openings to allow passage therethrough by a corresponding number of prongs of an appliance connector such that the prongs can be inserted into or otherwise connected to a power supply connector. For example, three openings 1501, 1502, and 1503 can be used, where three prongs of a power connector such as an AC plug can be inserted through these openings to connect to hot, neutral, and ground connections of an electrical socket, respectively. Other implementations can use a different number, configuration, and/or shapes of openings 1501-1503 depending on the configuration of connector prongs and socket openings.

In some implementations, a portion of the area of circuit board 1500 can hold platform circuitry 1506, and another portion can hold sensor circuitry 1508. Both the platform circuitry 1506 and the sensor circuitry 1508 can be powered, in this non-limiting example, by coupling to a hot contact 1512, associated with opening 1503, which receives current from the hot prong of an appliance connector inserted through the openings of the circuit board 1500. In certain other example embodiments, a neutral contact 1514 associated with opening 1503 can be coupled to the platform circuitry 1506 and/or the sensor circuitry 1508. Platform circuitry 1506 can be connected to the sensor circuitry 1508 via a connection 1515. The sensor circuitry 1508 can include one or more sensors 1510, such as sensors integrated on the circuit board 1500 in some implementations. Various implementations can also, or alternatively, provide one or more sensors 1510 separately from and connected to the circuit board 1500.

In the implementation shown in FIG. 15, a sensor 1510 is included in the sensor circuitry 1508 to sense one or more environmental characteristics. In some examples described herein, the sensor can sense one or more characteristics of current flowing through the hot conductor of the appliance prong 1503. For example, a magnetic field caused by the current can be sensed to derive the magnitude of current flowing through the connector over time. In some implementations, for example, the sensing gasket can sense other environmental characteristics instead of or in addition to sensing current. In various implementations, one or more sensors can sense one or more of a variety of different environment characteristics, including temperature, pressure, electric and magnetic fields, vibration, movement, gas and vapor concentration, odor, power, audio sounds, visual images or colors or patterns, etc.

The sensor circuitry 1508 and/or platform circuitry 1506 can obtain one or more signals derived from the sensed characteristic sensed by the sensor 1510 and provide one or more signals suitable to be transmitted from the gasket. In some implementations, the platform circuitry 1506 can include wireless transceiver circuitry 1516 (functionally shown in FIG. 15) which is connected via a connection 1518 to an antenna 1520 to transmit the sensor-derived signals wirelessly. In some implementations, the antenna can also receive wireless signals, such as from data collector and/or server (not shown). In some examples, the antenna 1520 can be configured to wrap around the periphery of the gasket circuit board 1500 near the edge of the board, as shown. In other implementations, antenna 1520 can be a straight or linearly-shaped conductor or be of a different shape or configuration. In yet other implementations, the functionality of the antenna 1520 can be provided by an antenna integrated circuit chip. In some examples, antenna chips provided by Fractus S.A. or Johanson Technology, Inc. can be suitable for some implementations.

Figure 16:
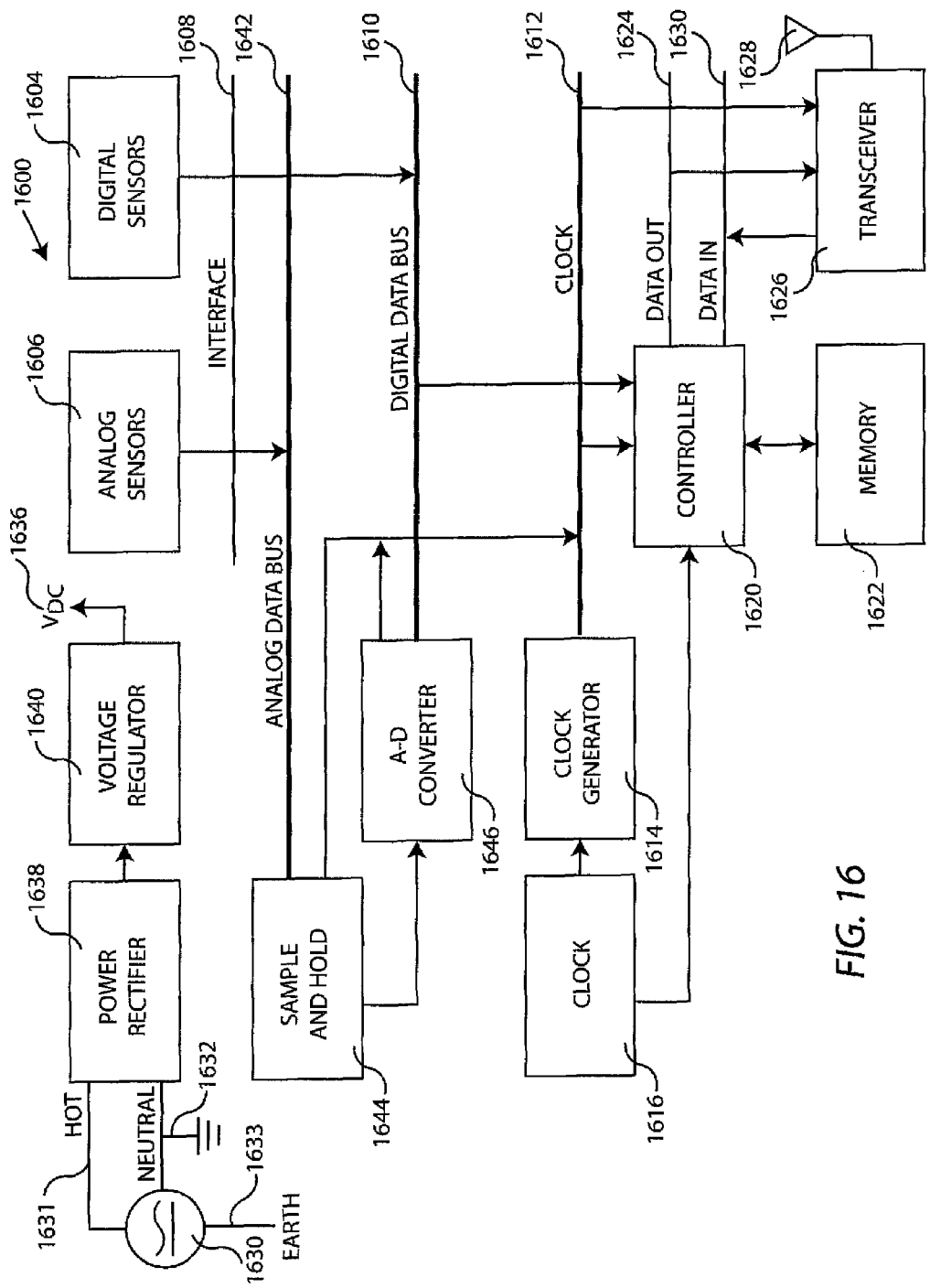
FIG. 16 is a block diagram illustrating a component system of a sensing gasket according to some implementations.

FIG. 16 is a block diagram illustrating a component system 1600 of a sensing apparatus such as a sensing gasket according to some implementations. For example, in some implementations the components of the component system 1600 can include circuitry such as platform circuitry 1506 and/or sensor circuitry 1508 as shown in FIG. 15. In other embodiments, the circuitry can be compartmentalized or divided in other ways or based on other functionality. In various implementations, one or more digital sensors 1604 and/or one or more analog sensors 1606 can be used to sense environmental conditions relative to the sensors or gasket. For example, in some implementations a single digital or analog sensor can be used, while in other implementations multiple digital and/or analog sensors can be used.

The system 1600 can include a standard interface 1608 to connect the sensors 1604 and/or 1606. The interface 1608 supports electrical connections from digital sensors 1604 to a digital data bus 1610 and a clock bus 1612. The digital data bus 1610 can receive sensor data describing one or more sensed environmental conditions as sensed by the digital sensors 1604. A clock signal on clock bus 1612 can be generated by clock generator circuitry 1614 which can generate the signal based on input from a real-time clock 1616. The clock signal can be used by the digital sensors 1604 to time the sensing of environmental conditions, among other timing functions used by the circuitry.

A controller 1620 can be connected to the digital data bus 1610, clock bus 1612, real time clock 1616 and a memory 1622. For example, the controller 1620 can be any suitable processor, such as one or more microprocessors, microcontrollers, application-specific integrated circuits (ASICs), logic gates, etc. Received sensor data can be processed by the controller 1620 and resulting processed data placed on a data out bus 1624. This output data can be sent to a data collector, server, or other device. For example, in some implementations the data can be output wirelessly by transceiver 1626, which can be coupled to an antenna 1628. For example, data can be transmitted periodically by the transceiver 1626 based on environmental characteristics continually being sensed by the sensors 1604 and/or 1606. The transceiver 1626 can also be capable of receiving data wirelessly from other devices such as data collector and/or server (not shown). For example, the received data can include program instructions, commands, parameters, and/or data, which can be placed on the data input bus 1630 and provided to controller 1620. Memory 1622 can be utilized to store buffered incoming and outgoing sensor data, program instructions for controller 1620, parameters, or other data. In some implementations, controller 1620 can include the memory 1622 and/or additional memory to memory 1622 as integrated memory for storing some or all of these types of data.

Power for component system 1600 can in some implementations be provided from an AC voltage of a connected power source 1630, which in some examples can be an electrical outlet 1630 including a hot terminal 1631, neutral terminal 1632, and optionally an earth ground connection 1633. The AC voltage 1630 can be converted to a controlled DC voltage 1636 utilizing power rectifier 1638 and voltage regulator 1640. The DC voltage can be used as a supply by the gasket circuitry, sensors, and any other components of the gasket. In other implementations, the component system 1600 can receive power from different and/or additional power sources, such as batteries. In some implementations, power can be wirelessly transmitted from a remote source. For example, magnetic resonators can be used to transfer power wirelessly over distances.

Some implementations can alternatively or additionally use one or more analog sensors 1606 providing analog sensor signals. Additional converter circuitry, such as a sample-and-hold and/or analog-to-digital converter, can be included in such implementations to convert the analog sensor signals to a digital format. For example, the output of analog sensor 1606 can be coupled to an analog data bus 1642, which in turn can be coupled to a sample and hold block 1644 which uses the clock signal from clock bus 1612 to sample the analog sensor signals. The sampled signals can be provided to an analog-to-digital converter that converts the received analog data to digital data for use by the controller 1620. In various implementations, the analog-to-digital converter can be integrated in the controller 1620, or the analog-to-digital converter can be a separate component 1646 which converts the analog signal from the sample and hold block 1644 to digital data and provides that digital data on the digital data bus 1610 to the controller 1620.

In implementations using a wireless transceiver 1626, any of a variety of wireless protocols can be used. In one example implementation, a ZigBee transceiver design can be used that is based on the 802.15.4 radio transmission protocol, such as a Zigbit™ chip from Atmel Corporation. In another example implementation, wireless standards such as Wi-Fi based on 802.11 or Bluetooth can be used with components designed for that standard. In some non-limiting examples, programmable microcontroller (MCU) 2205 and Wi-Fi transceiver 2210 from Cypress Semiconductor Corporation can be used.

FIG. 17 is a side view of one example implementation of a gasket 1700. In some embodiments, one or more edges 1702 of the gasket 1700 can include various connectors, interfaces, indicators, and/or other I/O components. In some examples, an interface connector 1704 can be provided for a standard interface such as USB or other type. The connector 1704 can allow connection of the gasket to a variety of devices, such as to a computer, cell phone, or other electronic device to facilitate configuration and programming of the gasket code, parameters and/or operation, connection to additional memory, peripherals, or sensors, etc. A memory slot 1706 can be provided to connect to separate, small form-factor memory modules such as micro-SD. LED light indicators 1708 can be provided to indicate any of a variety of gasket states, sensor states, I/O states, etc. A reset button 1710 can be provided to allow reset of one or more states of the gasket 1700. A sensor connector 1712 can be used in some implementations to connect a separate sensor module that allows placement of one or more gasket sensors in a different location in the vicinity of the gasket 1700.

FIG. 18 is a top plan view of an example implementation of a separate sensor module which can be used with some implementations of a gasket described herein. In some implementations, the sensor circuit of the gasket can constructed on the same circuit board substrate as the platform circuitry, as shown in the example of FIG. 15, or in another substrate included in the housing of the gasket. In other implementations, the sensor circuitry 1508 and platform circuitry 1506 as shown in FIG. 15 can be provided on separate circuit boards in separate modules, and can be connected together as interlocking modules. For example, the sensor circuit 1508 can be included in a small form factor module 1800 having a circuit board 1802 and a connector 1804 on one side of the circuit board 1802. Some implementations can provide a portion of the sensor circuit 1508 in module 1800 and another portion in the gasket. Connector 1804 can in some implementations correspond to a standard interface 1608 as shown in FIG. 16. For example, some implementations can allow sensor modules to be supplied by one or more additional suppliers which can connect to the standard interface connector on the gasket housing. Sensor circuit 1806 can be integrated on the circuit board 1802 of the sensor module 1800, and can include one or more sensors in some implementations, or can connect to a separate sensor provided on board 1802 or otherwise within a housing of the sensor module 1800.

Module 1800 can be connected to a connector of the gasket. In some implementations, the module 1800 can be connected to connector such as a slot 1712 on the side of the gasket 1700 shown in FIG. 17. Some implementations can connect the sensor module 1800 with a gasket using a cable or wire. The gasket 1700 can include platform circuitry such that connector 1804 makes electrical contact with that platform circuitry, e.g., via a standard interface 1608 to a bus on the platform circuitry. By separating the sensor module and the gasket platform, a generic gasket platform can be provided in the gasket. The generic gasket platform can be connected to a variety of multiple different sensor types by attaching the appropriate sensor module(s) to the platform, allowing different environmental characteristics to be sensed as appropriate to particular applications. In some implementations, multiple sensor slots 1712 can be provided on the gasket 1700, allowing multiple sensor modules 1800 to be connected, where the sensors of the connected modules can be the same or of differing types. Some implementations can allow sensors to be connected to a gasket via a standard interface connector such as USB, memory card connector, etc. Various implementations can include other components in a sensor module 1800 in addition to one or more sensors, such as processor(s), memory for storing sensor data, memory for storing program instructions for the processor(s), power supply, circuitry, etc. Furthermore, some implementations can use a similar removable module that does not include sensors or sensor circuitry and which includes one or more of the other components.

FIG. 19 is a side view of an example implementation 1900 of a gasket and sensor module allowing connection of a sensor module to a gasket platform. A sensor module 1902 can include sensor circuitry similarly as module 1800 of FIG. 18, and a gasket 1904 includes platform circuitry and a cavity 1906 provided in one side of the gasket 1904. Electrical contact can be made between leads 1908 on sensor module 1902 with corresponding contacts 1910 in the cavity 1906 of gasket 1904. In some implementations, the sensor module 1902 can snap into the cavity 1906 such that when the sensor module is snapped into place, the surface of sensor module 1902 opposite to its leads is approximately flush with the corresponding surface of gasket 1904, thus reducing the size of the overall gasket assembly.

Figure 20:
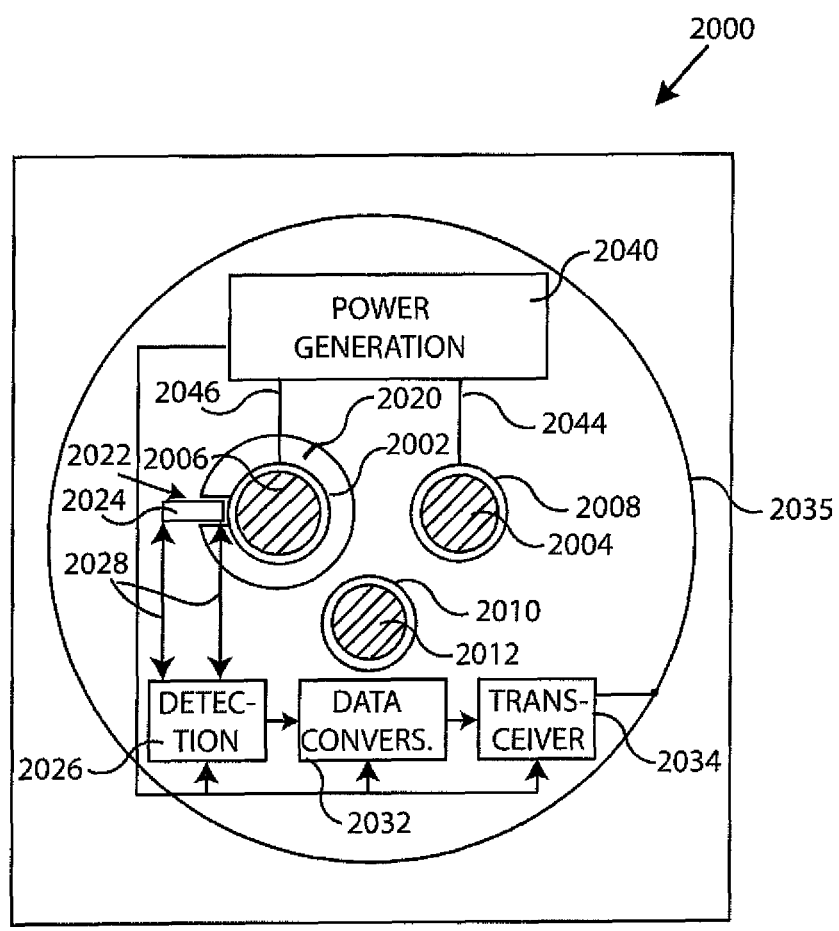
FIG. 20 is a top view of an example implementation of a gasket circuit board in which a magnetic sensor is used.

FIG. 20 is a top view of an example implementation of a circuit board 2000 which can be used in a sensing apparatus and in which a magnetic sensor is used. In some implementations, a gasket including circuit board 2000 is placed over the conductive prongs of an appliance connector, such as an AC plug head. In this non-limiting example, cross-sections of prongs 2002, 2004 and 2012 of an AC plug are shown within openings 2006, 2008 and 2010, respectively. In the described implementation, opening 2006 is designated as a "hot" opening and prong 2002 is designated the "hot" prong. Opening 2008 is designated as a "neutral" opening and prong 2008 is designated the "neutral" prong. In some implementations, opening 2010 is designated as a "ground" opening and prong 2012 is designated the "ground" prong.

A ring of material 2020 can be provided to surround the hot opening 2006, and a gap 2022 can be included in ring 2020. Ring 2020 can be made of a material that has the property of high magnetic permeability, such as a ferrite material. Current travelling through prong 2002 induces a magnetic field, and ring 2020 concentrates that magnetic field. This can increase the strength of the magnetic field for easier measurement as well as stabilize a signal sensed from the magnetic field by significantly reducing dependence on the distance between ring 2020 and prong 2002.

A sensor can be positioned to measure an intensity of the generated magnetic field. In the described implementation, a Hall effect sensor 2024 can be mounted within gap 2022 of the ring 2020. For example, the Hall effect sensor 2024 can be positioned at a right angle to the magnetic field concentrated by the ring 2020. The magnitude of the magnetic field that is experienced by the Hall effect sensor 2024 can be detected by detection circuitry 2026, which can be included in the sensor circuitry for example. The detection circuitry 2026 can be coupled to the Hall effect sensor 2024 through conductors 2028 and provides analog signals representative of the sensed magnetic field. The analog output of detection circuitry 2026 can be converted to a sensor signal in a digital data format by analog-to-digital data conversion circuitry 2032, which in turn can send the digital data signal to a transceiver such as a data transceiver 2034. In some implementations, the transceiver 2034 can transmit the digital data signal wirelessly via an antenna 2035 to any data collector or server within suitable range.

Detection circuitry 2026, data conversion circuitry 2032, and wireless data transceiver 2034 can be driven by power generated by a power generation circuit 2040. Circuit 2040 can be a DC power generation circuit in some implementations. Circuit 2040 can convert AC voltage on appliance prongs 2002 and 2004 to a DC voltage of a voltage, or of a range of voltages, needed for the gasket circuitry, such as 3V, 5V, 15V and/or 20V, or other suitable DC voltages or DC voltage ranges. In some implementations, the input voltage from prongs 2002 and 2004 is coupled to power generation circuit 2040 via conductive terminals 2044 and 2046. In one example, each terminal can be a conductive, flexible brush that brushes against or otherwise physically contacts an associated prong 2002 or 2004 while the gasket is slipped over the plug prongs through openings 2006 and 2008. In other implementations, other types of couplings can be used to provide voltage to the power generation circuit 2040, as described below.

Figure 21:
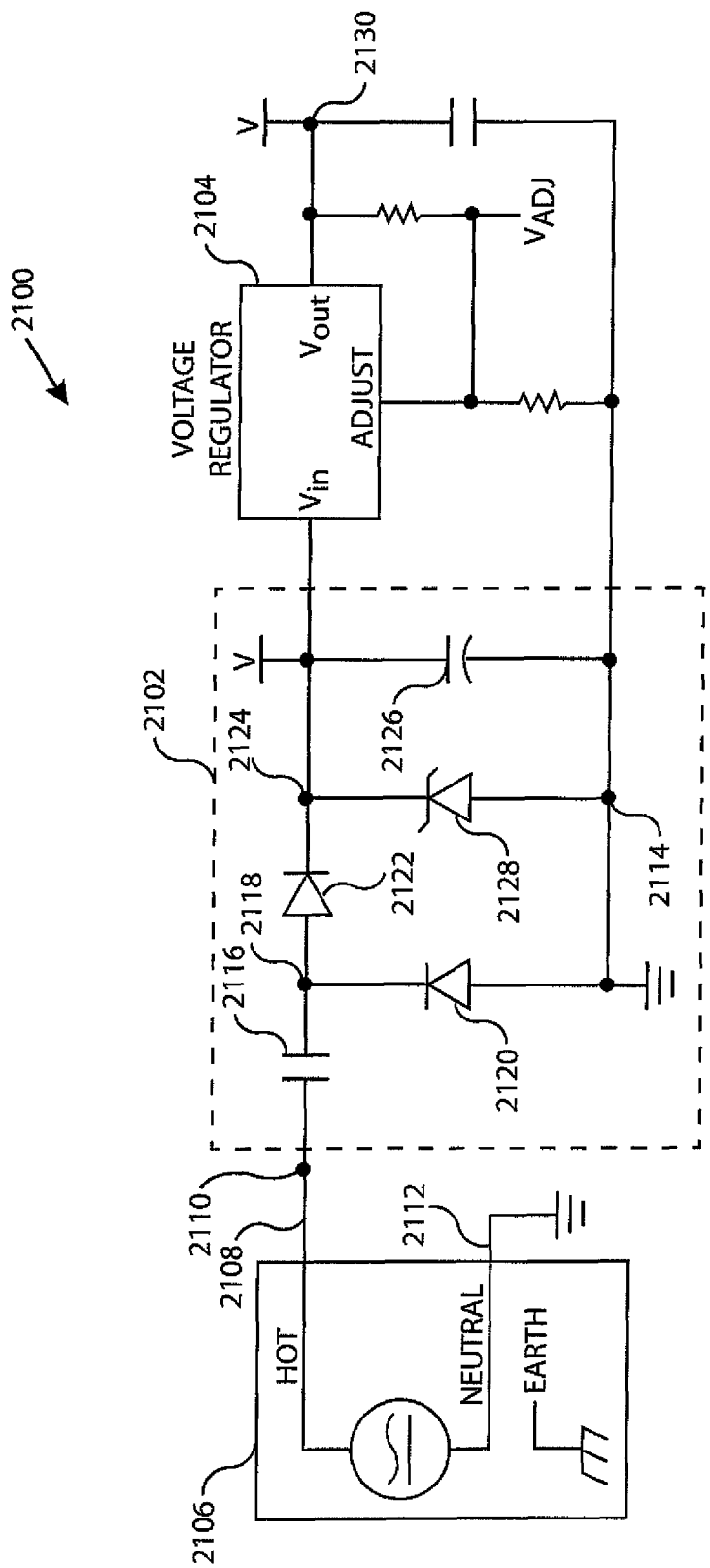
FIG. 21 is a schematic diagram illustrating an example power supply circuit suitable for some implementations of a sensing apparatus such as a gasket.

FIG. 21 is a schematic diagram illustrating an example power supply circuit 2100 suitable for some implementations of the sensing apparatus. Circuit 2100 includes a rectifier 2102 and a voltage regulator 2104 which collectively can generate DC power from an AC electric current. In some implementations, power supply circuit 2100 can be included in the platform circuitry of a gasket as described above, e.g., in DC power generation block 2040 of FIG. 20, for example.

Power supply 2106 is a power source to which the appliance connector is connected, such as an electrical socket of an outlet. The neutral connection 2112 of the power supply is coupled to the ground node 2114 of the circuit 2100. The hot connection 2108 from the power supply is coupled to an input node 2110 of the power supply circuit 2100, such as via any of the coupling implementations described above with respect to FIGS. 11-14.

Capacitor 2116 can be connected to couple input node 2110 to internal node 2118. The cathode of diode 2120 is connected to node 2118, and the anode is coupled to ground node 2114. The anode of diode 2122 is connected to node 2118, and the cathode is connected to output node 2124. Output storage capacitor 2126 is connected between output node 2124 and ground node 2114. Zener diode 2128 is connected in parallel with capacitor 2126 with its cathode coupled to output node 2124 and its anode coupled to ground node 2114.

The rectifier circuit 2102 rectifies the input voltage at node 2110 and stores a DC charge on capacitor 2126. The charge on node 2124 can be used as a power source to drive all or a subset of circuits on the gasket. The Zener diode 2128 clamps the voltage at a predetermined level, thereby keeping node 2124 from going above a desired voltage level. The output of rectifier circuit 2102 is provided to an input of a voltage regulator 2104. The output node 2130 of voltage regulator 2104 is a DC voltage that is used to power circuits on the gasket.

In other implementations of the rectifier circuit 2102, the operation is similar as described above except that the input voltage can be capacitively coupled from the conductors of the appliance connector. Some example embodiments of such a connection are described above with reference to FIGS. 13-14. In some capacitive-coupled implementations, a capacitor can be connected only between the hot connection and node 2118. In other implementations, a capacitor can be additionally coupled between the ground node and the neutral node.

Figure 22:
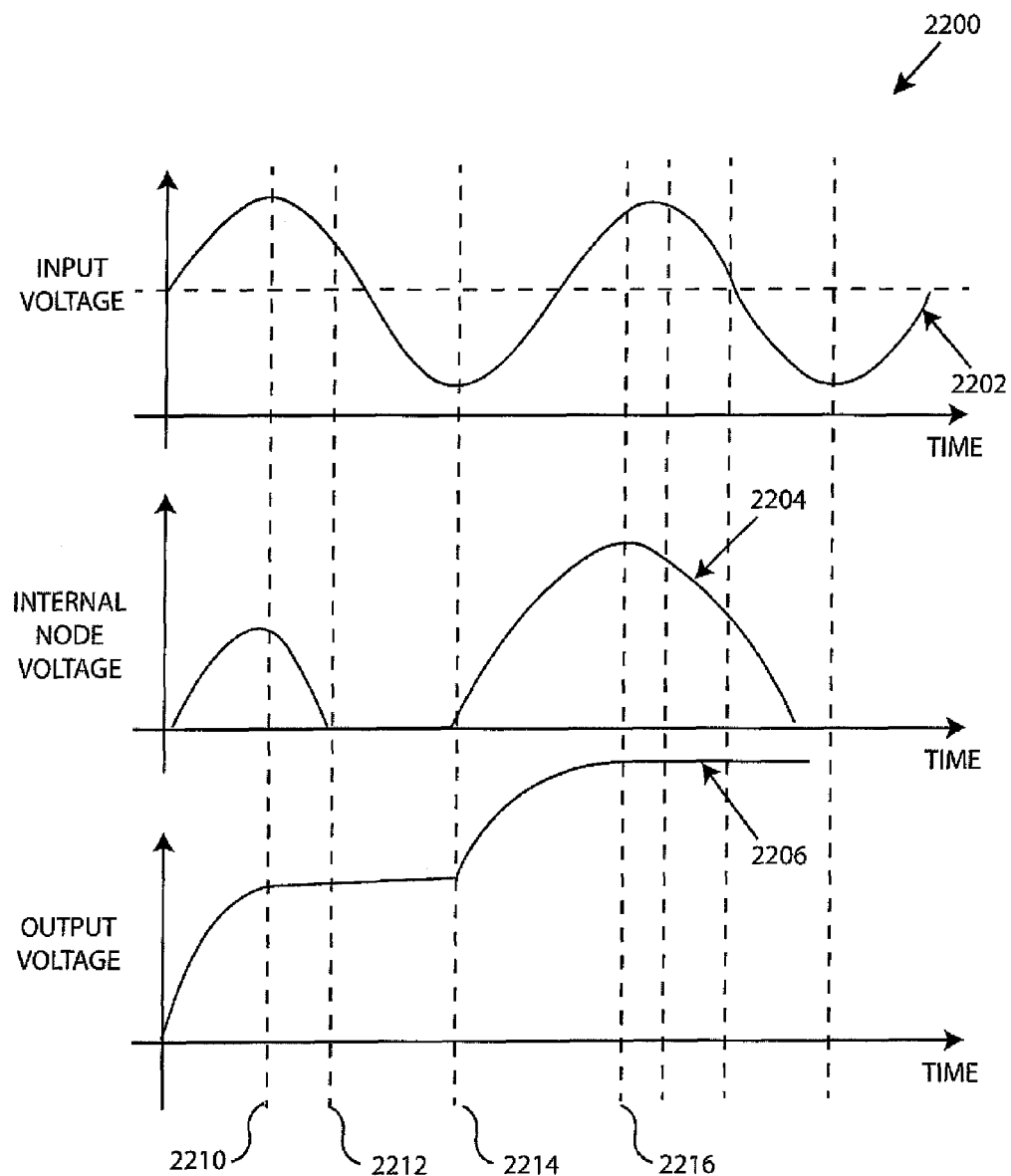
FIG. 22 is a diagrammatic illustration of the operation of the rectifier circuit example of FIG. 21.

FIG. 22 is a diagrammatic illustration 2200 of the operation of the rectifier circuit 2102 example of FIG. 21. The AC input voltage is represented by the sinusoidal waveform 2202. The internal node voltage at node 2118 is represented by waveform 2204. The output voltage at node 2124 is represented by waveform 2206. As waveform 2202 rises to a more positive voltage, waveform 2204 follows that voltage since it is coupled by capacitor 2116 of FIG. 21.

When the voltage on node 2118 is sufficiently greater than the voltage on output node 2124, diode 2122 conducts current. Therefore, waveform 2206 follows waveform 2204 to time point 2210. Beyond time point 2210, input waveform 2202 goes to a lower voltage. Waveform 2204 follows the voltage waveform 2202 since it is coupled by capacitor 2116. At this point, the voltage on node 2118 is lower than on node 2124, causing diode 2122 to no longer conduct current. Therefore, charge is trapped on storage capacitor 2126, maintaining a constant voltage at node 2124. These respective voltages are represented between time points 2210 and 2212.

At time point 2212, the voltage on node 2118 begins to go negative. This places diode 2120 into a state where it conducts current, thereby connecting node 2118 to ground 2114. For this reason, node 2118 is now maintained at about ground level. Since the voltage on node 2124 remains higher than node 2118, diode 2122 remains non-conducting, and the voltage on node 2124 continues to remain constant. These respective voltages are represented between time points 2212 and 2214.

At time point 2214, input voltage at node 2110 begins to swing to more positive voltages again. The voltage on internal node 2118 is coupled high through capacitor 2116. Since the voltage on node 2118 is now higher than ground 2114, diode 2120 goes into a non-conducting state. When the voltage on node 2118 exceeds the output voltage at node 2124, diode 2122 goes into a conducting state, thereby bringing node 2124 to a higher voltage. This is the case until input voltage at node 2110 begins to swing low again, which in turn will cause node 2118 to swing low into a lower voltage than node 2124. Diode 2120 will now go into a non-conducting state, trapping charge on output node 2124. These respective voltages are represented between time points 2214 and 2216.

The above describes rectifier circuit operation over one period of the AC input voltage cycle. When charge is drawn from node 2124 to drive circuitry on the gasket, the voltage on node 2124 will drop as well. Device sizes can be chosen such that the charge from storage capacitor 2126 consumed by circuitry on the gasket is replenished over subsequent AC input voltage cycles.

Figure 23:
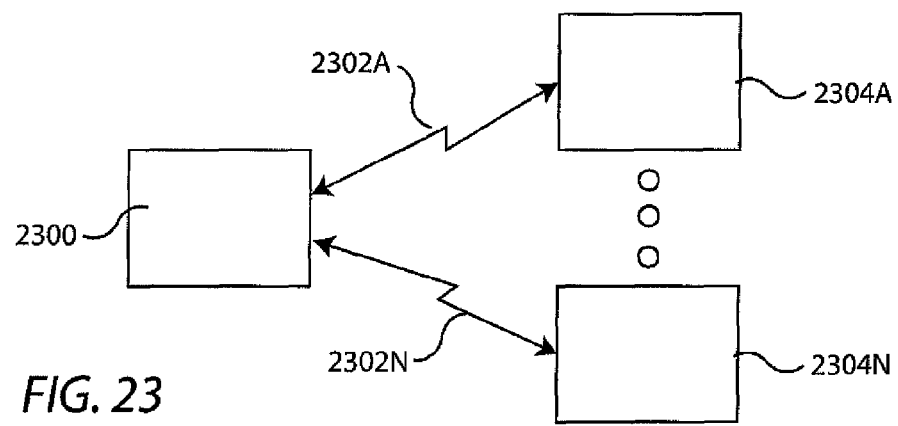
FIG. 23 is an illustration of a gasket in wireless communication with one or more other gaskets and/or apparatus.

FIG. 23 is an illustration of a gasket 2300 in wireless communication 2302A . . . 2302N with one or more other gaskets and/or apparatus ("wireless communication devices") 2304A . . . 2304N. As noted previously a number of radio frequency (RF) protocols, including WiFi and Bluetooth protocols, can be used for the communication. Furthermore, other wireless technologies such as optical, infrared (IR), acoustic, etc. can be used for the wireless communication. It should be noted that the communication can include power (transmitted, for example, by induction or by RF transmission) and/or data, and can be unidirectional or bidirectional. The wireless communication devices 2304A . . . 2304N can include other gaskets, repeaters, servers, collectors, sensors, etc. In other example embodiments, the wireless communication devices are in communication with each other and/or other wired or wireless devices.

In an example embodiment, an oscillating electric field, e.g. an RF field, can be generated by gasket 2300 and/or one or more of the wireless communication devices 2304A . . . 2304N using a suitable transmission antenna. A reception antenna can be tuned to have a high Q factor with respect to the transmission antenna. For example, wireless communication device 2304A can be an RF power transmitter and gasket 2300 can have an antenna which receives the RF power. In another example, gasket 2300 can have an RF power transmitter, and wireless communication device 2304N can be another gasket with an antenna that received the RF power from gasket 2300. In the latter example, a gasket with more power resources can send some of its power to an adjacent gasket.

Figure 24:
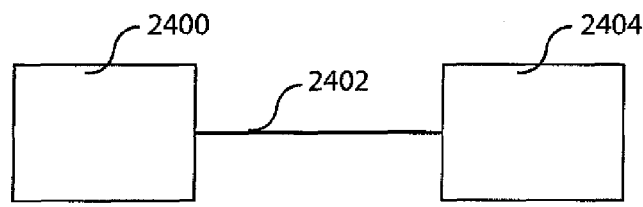
FIG. 24 is an illustration of a gasket in wired communication with another gasket or apparatus.

FIG. 24 is an illustration of a gasket 2400 in wired communication 2402 with another gasket or apparatus ("wired communication device") 2404. The wireless communication devices 2404 can be another gasket, a repeater, a server, a collector, a sensor, etc. In other example embodiments, a plurality of wired devices 2404 may be provided which can be in communication with each other and with other devices. By "wired communication 2402" it is meant herein that a physical wire, cable, fiber or channel ("wire") is coupled between the gasket 2400 and the wired communication device 2404. For example, the "wire" can be made from a conductive material such as copper, or optical fiber, or other physical medium. An advantage of optical fiber is that galvanic isolation can be provided between the gasket 2400 and the wired communication device 2404. It should be noted that the wired communication can include power and/or data, and can be unidirectional or bidirectional.

Figure 25:
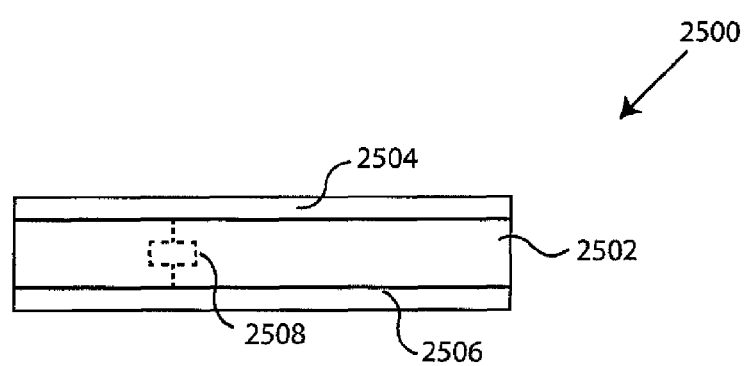
FIG. 25 is an elevational view of a gasket having upper and lower conductive layers.

FIG. 25 is an elevational view of a gasket 2500 having an insulating layer 2502, an upper conductive layer 2504, and a lower conductive layer 2506. Circuitry 2508 is disposed within the insulating layer 2502 and is coupled to the upper conductive layer 2504 and to the lower conductive layer 2506. In a non-limiting example, gasket 2500 can be configured to generate energy from a temperature differential between the upper conductive layer 2504 and the lower conductive layer 2506. For example, when gasket 2500 is installed in a motor or pump, the surface towards the motor will be hotter than the surface facing the air. Circuitry 2508 can include a number of thermocouples such that a voltage can be generated between plates 3504 and 2506 due to the well-known Seebeck Effect.

FIG. 26 is an elevational view of a gasket 2600 having a lower insulating layer 2602, an upper insulating layer 2604, and with one or more inner layers 2606. The inner layer(s) can be configured for such purposes as energy harvesting, energy and data transmission, and sensing. For example, an "electronic eye" sensor can be mounted on the edge of gasket 2600 and connected to inner layer(s) 2606 to detect motion or video in a limited range, or may be tethered to an edge of the gasket for a wider range.

FIG. 27A is an illustration of a first embodiment 2606A of inner layers 2606 of FIG. 27. The inner layers 2606A, in this non-limiting example, include a conductive layer 2702A in contact with lower insulating layer 2602, a conductive layer 2704A in contact with upper insulating layer 2604, a first semiconductor layer 2706A in contact with conductive layer 2702A, and a second semiconductor layer 2708A in contact with conductive layer 2704A. The first semiconductor layer 2706A and the second semiconductor layer 2708A are, in this non-limiting example, of opposite polarities, e.g. one of the layers is a p-type semiconductor and the other one of the layers is an n-type semiconductor. The first semiconductor layer 2706A and the second semiconductor layer 2708A meet at an interface 2710A. The semiconductor materials for layers 2706A and 2708A can be, for example, silicon or gallium arsenide. The conductive layers 2702A and 2704A can be, for example, copper, aluminum, organo-metallic films, etc.

In the example embodiment of FIG. 27A, an edge of the inside surface of the lower insulating layer 2602 is plated with conductive layer 2706A and makes contact with a ring of semiconductor material (e.g. p-type semiconductor material) 2706A. An edge of the inside surface of the upper insulating layer 2504 is plated with conductive layer 2704A which contacts a ring of an opposite polarity semiconductor material (e.g. n-type semiconductor material) 2708A. When the gasket body is compressed during use, a p/n junction interface 2710A will exist around the edge of gasket 2600. Light that hits the edge of the gasket 2600 will generate a potential difference between the conductive layer 2706A and 2704A which can be used as an energy source to charge, for example, a capacitor. In an alternate embodiment the n-type and p-type layers can be formed on the same side of the gasket body to insure a good junction between the layers.

FIG. 27B is an illustration of a second embodiment 2606B of inner layers 2606 of FIG. 27. The inner layers 2606B, in this non-limiting example, include a conductive layer 2702B in contact with lower insulating layer 2602, a conductive layer 2704B in contact with upper insulating layer 2604, and a piezoelectric (PZT) layer 2706B sandwiched between conductive layers 2702B and 2704B. The conductive layers 2702B and 2704B can be, for example, copper, aluminum or a conductive film. As will be appreciated by those of skill in the art, suitable materials for the piezoelectric layer 2706B include a variety of natural and synthetic crystals, synthetic ceramics, polymers and organic nanostructures. In an alternate embodiment, all three layer may be provide on one side of the gasket body.

The example embodiment of FIG. 27B can be uses to harvest vibrational energy, e.g. from a motor. The piezoelectric layer 2706B, when in compression, acts as a transducer to convert vibrational energy to an AC voltage that can be rectified and stored in a capacitor. In an embodiment, the structure of gasket 2600 is designed to maximize mechanical resonance with typical motor vibration frequencies. Gaskets can also be "trimmed" by adding or subtracting weights to increase mechanical resonance.

It will therefore be appreciated that several embodiments, as set forth herein by way of non-limiting example, provide an ambient energy powered electronic gasket including an insulating gasket body adapted to engage a surface of a powered device, and an electronic circuit enclosed within the gasket body including a DC power supply powered by an ambient energy source related to the powered device with which it is engaged. The ambient energy source can be, by way of non-limiting examples, an AC power source, electromagnetic radiation (e.g. power line radiation, radio frequency radiation, visible light radiation), induction, electrostatic, capacitive, magnetostrictive, mechanical, pressure, convection, conduction, motion, vibration, heat, chemical, chemical gradients, fluid flow, etc. It should also be noted that a gasket may employ multiple energy generation techniques to increase and/or stabilize power generation.

In certain example, circuitry is embedded in a body of a gasket. In other example embodiments, top and bottom "covers" of a gasket can be used for ambient energy harvesting. For example, covers can be used for: embedded antennas for electromagnetic radiation (e.g. WiFi, radiated AC electric, radio, TV, Bluetooth); thermocouple metal complements for heat; semiconductor p/n junctions for solar; PZT piezoelectric structures for vibrational; combinations of some or all of the preceding; and/or transfer of energy between gaskets.

In certain example embodiments, covers may be interchangeable with gasket sensor electronics. In other example embodiments, covers can store charge and act as a built-in UPS in the case of power loss. This can be accomplished, by way of non-limiting example, by forming large capacitors or supercaps on the inside surface of covers by depositing alternating layers of conductive and dielectric materials. In this fashion, gaskets can server as a backup power supply should a main power supply fail.

It will also be appreciated that, since the gaskets can generate DC electrical power, that certain embodiments can be provided with energy storage devices, such as batteries and/or capacitors. Also, providing a wireless (e.g. R.F. or IR) port or a wired (e.g. an electrical connector or dongle) port allows power and/or information to be transmitted from the gasket to other devices. In addition, sensors, such as heat, power consumption, and other sensors, can be provided either as a part of the electronic circuit of the gasket or externally to the gasket. For example, when the gasket is being used as part of a pump, a temperature sensor separate from the gasket can be connected to the gasket via a wireless or wired port.

It should be noted that the diagrams described herein may illustrate functional blocks and that the components may be arranged differently. These and other design variants will be appreciated by those of ordinary skill in the art. It should also be noted that various features and implementations for gaskets described herein can apply to other forms and types of sensing apparatus consistent with the disclosure.

Although various examples have been described using specific terms and devices, such description is for illustrative purposes only. The words used are words of description rather than of limitation. In addition, it should be understood that aspects of various other examples may be interchanged either in whole or in part. It is therefore intended that the claims be interpreted in accordance with their true spirit and scope and without limitation or estoppel.

What is claimed is:

1. An ambient energy powered electronic gasket for preventing fluid leakage between mating surfaces of objects joined for enabling pressurized fluid to flow between said objects, comprising:
   a unitary gasket body having a lower layer with a first surface, an upper layer with a second surface, and at least one inner layer sandwiched between the lower layer and the upper layer, wherein the gasket body is provided with at least one aperture between said first and second surfaces to enable fluid to flow through said at least one aperture, and a plurality of bolt-holes, the gasket body being configured to fill a space between mating surfaces of jointed objects, whereby the insulating gasket body prevents fluid leakage between the mating surfaces when held under compression by a plurality of bolts extending through the plurality of bolt-holes;
   an electronic circuit comprising the inner layer and entirely enclosed between the lower layer and the upper layer, the electronic circuit including a DC power supply powered by an ambient energy source related to a powered device with which it is engaged; and
   an electrical port electrically coupled to the DC power supply between the upper layer and the lower layer to provide electric power to circuitry external to the gasket body.

2. An ambient energy powered electronic gasket as recited in claim 1 wherein the ambient energy source is electromagnetic.

3. An ambient energy powered electronic gasket as recited in claim 2 wherein the electromagnetic ambient energy source is in a commercial power line frequency range.

4. An ambient energy powered electronic gasket as recited in claim 2 wherein the electromagnetic ambient energy source is in a radio frequency range.

5. An ambient energy powered electronic gasket as recited in claim 2 wherein the electromagnetic ambient energy source is in a visible light frequency range.

6. An ambient energy powered electronic gasket as recited in claim 1 wherein the ambient energy source is mechanical.

7. An ambient energy powered electronic gasket as recited in claim 1 wherein the ambient energy source includes pressure.

8. An ambient energy powered electronic gasket as recited in claim 1 wherein the ambient energy source includes motion.

9. An ambient energy powered electronic gasket as recited in claim 1 wherein the ambient energy source includes vibration.

10. An ambient energy powered electronic gasket as recited in claim 1 wherein the ambient energy source is heat.

11. An ambient energy powered electronic gasket as recited in claim 1 wherein the ambient energy source is chemical.

12. An ambient energy powered electronic gasket as recited in claim 1 wherein the ambient energy source is from fluid flow.

13. An ambient energy powered electronic gasket as recited in claim 1 wherein the inner layer further comprises a power storage device coupled to the DC power supply.

14. An ambient energy powered electronic gasket as recited in claim 13 wherein the power storage device is a battery.

15. An ambient energy powered electronic gasket as recited in claim 13 wherein the power storage device is a capacitor.

16. An ambient energy powered electronic gasket as recited in claim 1 wherein at least one of the lower layer, the upper layer, and the inner layer is an electrically insulating layer.

17. An ambient powered electronic gasket as recited in claim 16 wherein the electrical port is an edge connector.

18. An ambient powered electronic gasket as recited in claim 16 wherein the electrical port is a dongle.

19. An ambient powered electronic gasket as recited in claim 1 wherein the electronic circuit further includes a sensor which is also coupled to the electrical port.

\* \* \* \* \*